United States Patent [19]
Yiu et al.

[11] Patent Number: 5,691,938
[45] Date of Patent: Nov. 25, 1997

[54] NON-VOLATILE MEMORY CELL AND ARRAY ARCHITECTURE

[75] Inventors: Tom Dang-Hsing Yiu, Milpitas, Calif.; Fuchia Shone, Hsinchu, Taiwan; Tien-Ler Lin, Cupertino; Ling Chen, Sunnyvale, both of Calif.

[73] Assignee: Macronix International Co., Ltd., Hsinchu, Taiwan

[21] Appl. No.: 237,226

[22] Filed: May 3, 1994

Related U.S. Application Data

[60] Continuation of Ser. No. 66,884, May 25, 1993, abandoned, which is a division of Ser. No. 823,882, Jan. 22, 1992, abandoned.

[51] Int. Cl.$^6$ .................................................. G11C 16/06
[52] U.S. Cl. .......................... 365/185.11; 365/185.06; 365/185.13; 365/185.16; 365/63; 365/72; 257/316
[58] Field of Search .......................... 365/63, 72, 185, 365/218, 230.03, 200, 185.13, 185.16, 185.11, 185.06

[56] References Cited

U.S. PATENT DOCUMENTS

| | | |
|---|---|---|
| 4,258,378 | 3/1981 | Wall . |
| 4,639,893 | 1/1987 | Eitan . |
| 4,698,787 | 10/1987 | Mukherjee et al. . |

(List continued on next page.)

FOREIGN PATENT DOCUMENTS

| | | |
|---|---|---|
| A0 298430 | 1/1989 | European Pat. Off. . |
| A0 354858 | 2/1990 | European Pat. Off. . |
| A0 386631 | 9/1990 | European Pat. Off. . |
| A0 422347 | 4/1991 | European Pat. Off. . |
| A0 461764 | 12/1991 | European Pat. Off. . |
| A2 241380 | 8/1991 | United Kingdom . |

OTHER PUBLICATIONS

"Alternate Metal Virtual Ground EPROM Array Implemented in a 0.8μm Process for Very High Density Applications"; Kazerounian, et al., 1991 IEEE, pp. 11.5.1–11.5.4.

"A Symmetrical Side Wall (SSW)–DSA Cell for a 64 Mbit Flash Memory"; Kodama, et al., 1991 IEEE, pp. 11.3.1–11.3.4.

"An Experimental 4–Mb Flash EEPROM with Sector Erase"; McConnell, et al., 1991 IEEE Journal of Solid State Circuits, Apr. 1991.

"A Novel Memory Cell Using Flash Array Contactless EPROM (FACE) Technology"; Woo, et al., 1990 IEEE, pp. 5.1.1–5.1.4.

(List continued on next page.)

*Primary Examiner*—Joseph E. Clawson, Jr.
*Attorney, Agent, or Firm*—Wilson Sonsini Goodrich & Rosati

[57] ABSTRACT

An improved contactless EPROM array, EPROM cell design, and method for fabricating the same is based on a unique drain-source-drain configuration, in which a single source diffusion is shared by two columns of transistors. An elongated first drain diffusion region, an elongated source diffusion region, and an elongated second drain diffusion region, are formed in a semi-conductor substrate along essentially parallel lines. Field oxide regions are grown on opposite sides of the first and second drain diffusion regions. Floating gates and control gate wordlines are formed orthogonal to the drain-source-drain structure to establish two columns of storage cells having a shared source region. The shared source region is coupled through a bottom block select transistor to a virtual ground terminal. Each drain diffusion region is-coupled through a top block select transistor to global bitline. The cell structure uses two metal global bitlines which extend essentially parallel to the drain, source and drain diffusion regions, and a virtual ground conductor which couples a plurality of columns of transistors to a virtual ground terminal through a horizontal conductor, such as a buried diffusion line.

23 Claims, 8 Drawing Sheets

U.S. PATENT DOCUMENTS

| | | | |
|---|---|---|---|
| 4,780,424 | 10/1988 | Holler et al. . | |
| 4,792,925 | 12/1988 | Corda et al. . | |
| 4,947,378 | 8/1990 | Jinbo et al. | 365/200 |
| 4,949,309 | 8/1990 | Rao | 365/185 |
| 4,972,378 | 11/1990 | Kitagawa et al. | 365/185 |
| 4,996,571 | 2/1991 | Kume et al. | 365/185 |
| 5,023,681 | 6/1991 | Ha | 365/230.03 |
| 5,023,837 | 6/1991 | Schreck et al. | 365/185 |
| 5,028,979 | 7/1991 | Mazzali . | |
| 5,045,489 | 9/1991 | Gill et al. . | |
| 5,047,981 | 9/1991 | Gill et al. | 365/218 |
| 5,060,195 | 10/1991 | Gill et al. | 257/316 |
| 5,110,753 | 5/1992 | Gill et al. . | |
| 5,115,288 | 5/1992 | Manley . | |
| 5,122,985 | 6/1992 | Santin | 365/185 |
| 5,132,933 | 7/1992 | Schreck et al. | 365/185 |
| 5,134,449 | 7/1992 | Gill et al. | 365/218 |
| 5,168,335 | 12/1992 | D'Arrigo et al. | 257/319 |
| 5,185,718 | 2/1993 | Rinerson et al. | 365/185 |
| 5,187,683 | 2/1993 | Gill et al. | 365/185 |
| 5,199,001 | 3/1993 | Tzeng | 365/218 |
| 5,229,968 | 7/1993 | Ito et al. | 365/185 |
| 5,245,570 | 9/1993 | Fazio et al. | 365/230.03 |
| 5,264,384 | 11/1993 | Kaya et al. . | |
| 5,283,758 | 2/1994 | Nakayama et al. | 365/230.03 |
| 5,296,396 | 3/1994 | Bellezza . | |
| 5,304,829 | 4/1994 | Mori et al. . | |
| 5,345,416 | 9/1994 | Nakagawara | 365/185.16 |
| 5,371,030 | 12/1994 | Bergemont . | |
| 5,384,742 | 1/1995 | Miyakawa et al. | 365/185.13 |
| 5,418,742 | 5/1995 | Asano | 365/230.03 |
| 5,420,060 | 5/1995 | Gill et al. . | |

OTHER PUBLICATIONS

"A Poly–Buffered FACE Technology For High Density Flash Memories"; Woo, et al., 1991 Symposium on VLSI Technology, pp. 73–74.

M. Okada et al., "16 Mb ROM Design Using Bank Select Arch.," Symposium on VLSI Circuits, Tokyo, Japan, Aug. 22, 24, 1988, Digest of Technical Papers, pp. 85–86.

NON-VOLATILE MEMORY CELL AND ARRAY ARCHITECTURE

This application is a continuation of application Ser. No. 08/066,884, filed May 25, 1993, which is a divisional application of application Ser. No. 07/823,882, filed Jan. 22, 1992, both abandoned.

BACKGROUND OF THE INVENTION

1. Field of the Invention

The present invention relates to non-volatile digital memories, and more particularly, to improved FLASH EPROM memory technology.

2. Description of Related Art

FLASH EPROMs are a growing class of non-volatile storage integrated circuits. These FLASH EPROMs have the capability of electrically erasing, programming or reading a memory cell in the chip. The memory cells in a FLASH EPROM are formed using so-called floating gate transistors in which the data is stored in a cell by charging or discharging the floating gate. The floating gate is a conductive material, typically made of polysilicon, which is insulated from the channel of the transistor by a thin layer of oxide or other insulating material, and insulated from the control gate or wordline of the transistor by a second layer of insulating material.

The act of charging the floating gate is termed the "program" step for a FLASH EPROM. This is accomplished through so-called hot electron injection by establishing a large positive voltage between the gate and source, as much as twelve volts, and a positive voltage between the drain and source, for instance, seven volts.

The act of discharging the floating gate is called the "erase" function for a FLASH EPROM. This erase function is typically carried out by a F-N tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage can be as much as twelve volts.

Details concerning the structure and function of prior art FLASH EPROMS can be seen upon review of the following U.S. Patents which are incorporated by reference for the purpose of teaching the background of related technology.

Mukherjee, et al., U.S. Pat. No. 4,698,787 issued Oct. 6, 1987;

Holler, et al., U.S. Pat. No. 4,780,423, issued Oct. 25, 1988.

More advanced technology concerning FLASH EPROM integrated circuits is set out in Woo, et al., "A Novel Memory Cell Using Flash Array Contactless EPROM (FACE) Technology" IEDM 1990, Published by the IEEE, pages 91–94. Also, Woo, et al., "A Poly-Buffered "FACE" Technology for High Density Memories", 1991 SYMPOSIUM ON VLSI TECHNOLOGY, pages 73–74. One prior art "contactless" array EPROM architecture is described in Kazerounian, et al., "Alternate Metal Virtual Ground EPROM Array Implemented In A 0.8 μM Process for Very High Density Applications", IEDM, published by IEEE, 1991, pages 11.5.1–11.5.4.

As evidenced by the Woo, et al. and Kazerounian, et al. publications, there is increasing interest in-contactless array non-volatile memory design. So-called contactless arrays include an array of storage cells which are coupled to one another by buried diffusion, and the buried diffusion is only periodically coupled through contacts to a metal bitline. Earlier FLASH EPROM designs such as the Mukherjee, et al. system required a "half" metal contact for each memory cell. Because metal contacts use a significant area on an integrated circuit they are a major impediment to creating a high density memory technology. Furthermore, as the device becomes smaller and smaller, the area reduction becomes limited by the metal over contact pitches of adjacent drain and source bitlines used to access the storage cells in the array.

Therefore, it is desirable to provide a FLASH EPROM cell, EPROM architecture, and a method of fabricating the same which results in a high density non-volatile memory circuit.

SUMMARY OF THE INVENTION

The present invention provides novel contactless FLASH EPROM cell and array designs, and methods for fabricating the same which results in a dense, segmentable FLASH EPROM chip. The FLASH EPROM cell is based on a unique drain-source-drain configuration, in which the single source diffusion is shared by two columns of transistors. Also a new memory circuit architecture suited for the FLASH EPROM cells of the present invention is provided.

Thus, according to one aspect of the present invention, a floating gate transistor array is provided. An elongated first drain diffusion region, an elongated source diffusion region, and an elongated second drain diffusion region, are formed in a semiconductor substrate along essentially parallel lines. Field oxide regions are grown on opposite sides of the first and second drain diffusion regions. Floating gates and control gate wordlines are formed orthogonal to the drain-source-drain structure to establish two columns of storage cells having a shared source region. The shared source region is coupled through a bottom block select transistor to a virtual ground terminal. Each drain diffusion region is coupled through a top block select transistor to a global bitline. The cell structure according to this aspect of the invention uses two metal global bitlines which extend essentially parallel to the drain source and drain diffusion regions, and a virtual ground supply which couples a plurality of columns of transistors to a virtual ground terminal through a horizontal conductor, such as a buried diffusion line. Thus, only two metal contact pitches are required per two transistor cell.

According to another aspect of the invention, a plurality of these drain-source-drain blocks are coupled into a large integrated circuit array, to provide high density non-volatile storage. This non-volatile storage is segmentable along block boundaries using the top and bottom block select transistors, which allows for segmented erase-operations. Also, the block select feature couples a single block of memory cells to a global bitline at a time. This results in improved resistance to leakage currents in transistors along a given column of the array.

Thus, a memory circuit is provided which comprises K subarrays having N columns and M rows of storage cells each. Storage cells in the columns of storage cells having respective first terminals, second terminals and control terminals. A plurality of wordlines coupled to the control terminals of the storage cells in respective rows is provided. N global bitlines, one corresponding to each column of storage cells, and a plurality of local bitlines, each coupled to the first terminals of the M storage cells in respective columns within a respective subarray are provided. Top block select transistors selectively connect the local bitlines in a subarray of storage cells to corresponding global bitlines in response to subarray select signals. Further included are plurality of local virtual ground lines each coupled to the second terminals of storage cells in columns with a respective subarray, and means for connecting the local virtual ground lines in the subarray to a virtual ground terminal. Column select transistors coupled to the global bitlines, selectively enable access to the N columns of storage cells.

In addition to the cell and architecture outlined above, a method of fabricating an array of floating gate devices is provided. A first method comprises:

defining a plurality of drain diffusion regions elongated in a first direction;

doping the drain diffusion regions;

establishing a tunnel insulating material on the substrate at least in regions adjacent the drain diffusion regions;

establishing a floating gate conductive material over the tunnel insulating material at least in regions adjacent the drain diffusion regions;

establishing a control gate insulating material over the floating gate conductive material;

exposing elongated source diffusion regions through the floating gate conductive material in the substrate, and aligned with the floating gate conductive material;

doping the source diffusion regions;

establishing an insulating layer over the source diffusion regions and any exposed floating gate conductive material; and forming a plurality of rows of conductive material over the control insulating material and floating gate conductive material.

A second method for fabricating the integrated circuit comprises:

establishing tunnel insulating material over the substrate at least in elongated channel regions;

establishing a floating gate conductive material over the tunnel insulating material at least in the elongated channel regions;

establishing a control gate insulating material over the floating gate conductive material;

exposing elongated source diffusion regions and drain diffusion regions in the substrate, aligned with the floating gate conductive material;

doping the drain diffusion regions with a first distribution of dopants;

doping the source diffusion region with a second distribution of dopants;

growing an insulating layer over the source and drain diffusion regions and any exposed floating gate conductive material; and forming a plurality of rows of conductive material over the control insulating material and floating gate conductive material.

According to the first method, the source diffusion regions in the cell structures are self-aligned to the floating gate transistors in adjacent columns of transistors The drain diffusion regions are likewise self-aligned to the insulating region on opposite sides of each block. According to the second method, both the drain and source diffusion regions are self-aligned to the floating gate. Furthermore, the source is implanted with dopant distributions which provide a gradual junction to facilitate tunneling during source erase operations.

Other aspects and advantages of the present invention can be seen upon review of the figures, the detailed description, and the claims which follow.

DETAILED DESCRIPTION

Figure 1:
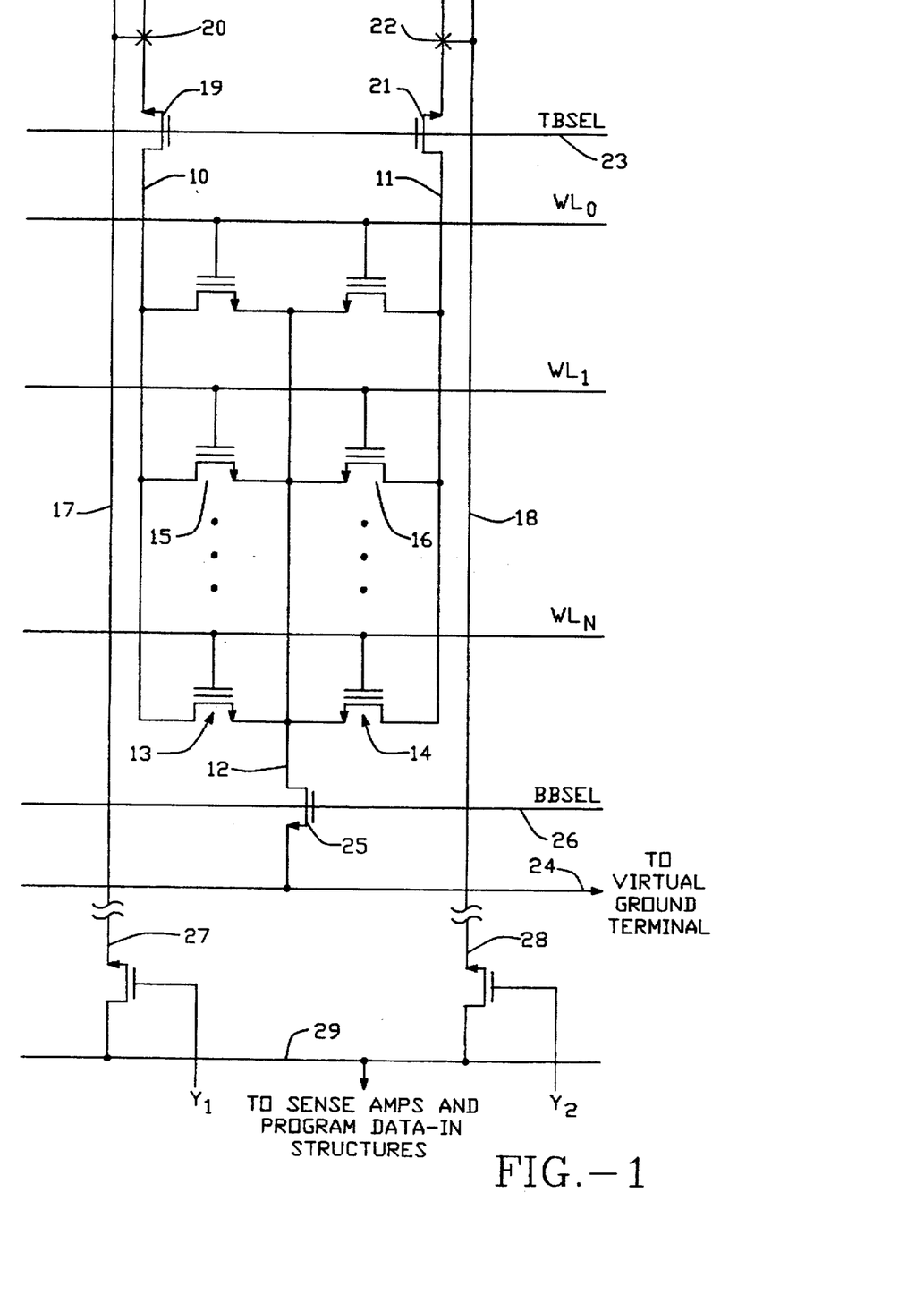
FIG. 1 is a circuit diagram of a FLASH EPROM circuit according to the present invention.
Figure 2:
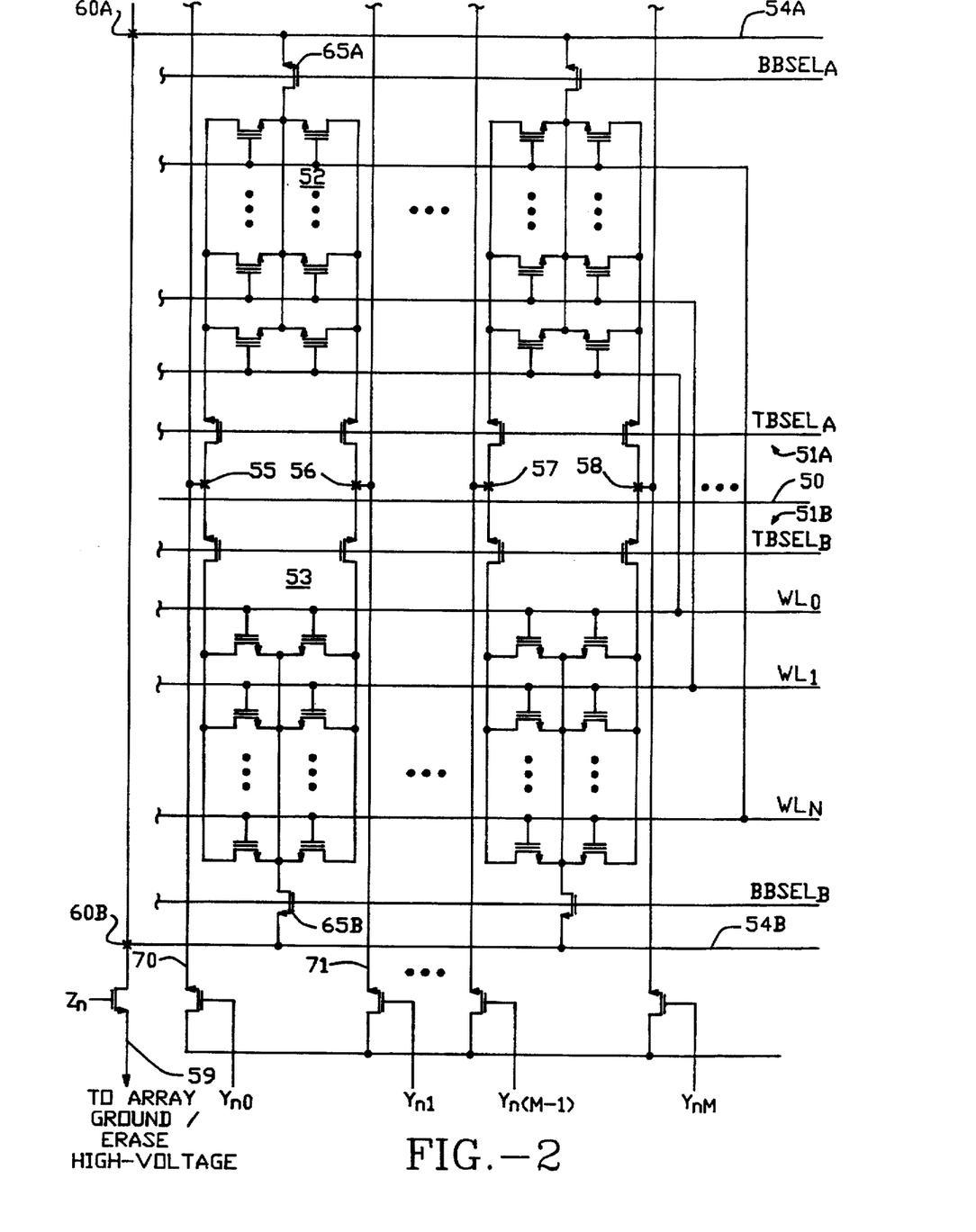
FIG. 2 is a schematic diagram illustrating the layout of two subarrays of FLASH EPROM cells according to the present invention.
Figure 3:
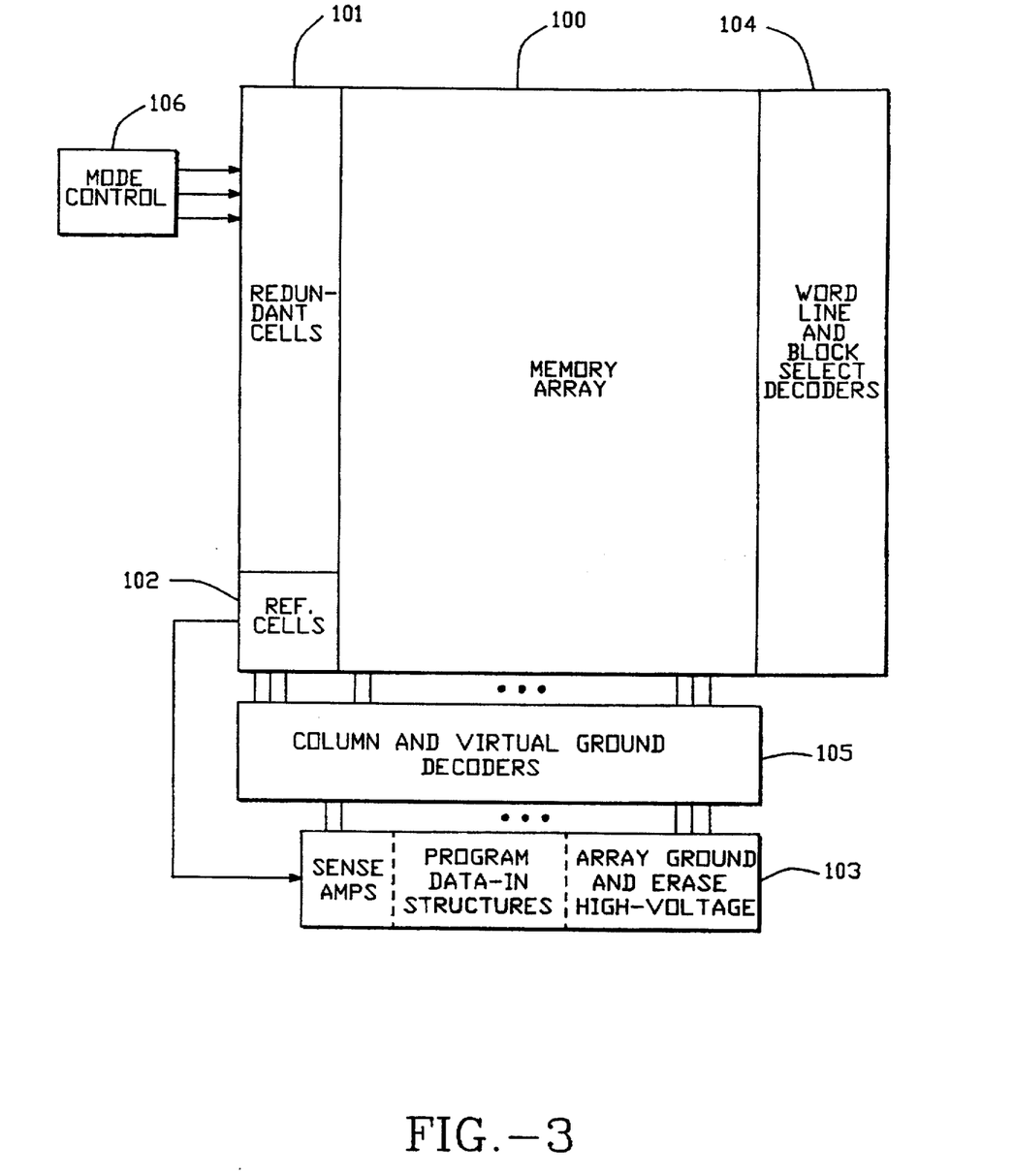
FIG. 3 is a diagram of a FLASH EPROM integrated circuit according to the present invention.

A detailed description of preferred embodiments of the present invention is provided with respect to FIGS. 1 through 7. FIGS. 1 through 3 provide a circuit diagram view of a FLASH EPROM architecture according to the present invention. FIGS. 4A–4H, 5A–5G and 6 illustrate first and second FLASH EPROM cell types according to the present invention, and methods for fabricating same.

FIG. 1 illustrates the drain-source-drain configuration of the FLASH EPROM circuit according to the present invention. The circuit includes a first local bitline 10 and a second local bitline 11. The first and second local bitlines 10, 11 are implemented by buried diffusion conductors as described below. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 12. The gates of the floating gate transistor are coupled to wordlines $WL_O$ through $WL_N$, where each wordline (e.g., $W_1$) is coupled to the gate of a transistor (e.g., transistor 15) in the first column 13 and a transistor (e.g., transistor 16) in the second column 14. Thus, transistors 15 and 16 can be considered a two transistor cell with a shared source diffusion.

The act of charging the floating gate is called the program step for the FLASH EPROM cell. This is accomplished through hot electron injection by establishing a large positive voltage between the gate and the source, such as twelve volts, and a positive voltage between the drain and the source, such as six volts.

The act of discharging the floating gate is called the erase step for the FLASH EPROM cell. This is accomplished through F-N tunneling mechanism between the floating gate and the source (source erase) or between the floating gate anti the substrate (channel erase). The source erasing is performed by applying a positive bias to the source, such as twelve volts or eight volts, while the gate is grounded or negatively biased, such as minus eight volts. The channel erasing is performed by applying a negative bias to the gate and/or a positive bias to the substrate.

A first global bitline 17 and a second global bitline 18 are associated with each drain-source-drain block as shown in FIG. 1. The first global bitline 17 is coupled to the source of top block select transistor 19 through a metal-to-diffusion contact 20. Similarly, the second global bitline 18 is coupled to the source of top block select transistor 21 through a metal-to-diffusion contact 22. The drains of the top block select transistors 19, 21 are coupled to the first and second local bitlines 10 and 11, respectively. The gates of the top block selector transistors 19, 21 are controlled by a top block select signal TBSEL on line 23.

The local virtual ground line 12 is coupled to a virtual ground terminal across conductor 24 through bottom block selector transistor 25. The drain of the bottom block select transistor 25 is coupled to the local virtual ground line 12. The source of the bottom block select transistor 25 is coupled to the conductor 24. The gate of the bottom block select transistor 25 is controlled by a bottom block select signal BBSEL across line 26. In the preferred system, the conductor 24 is a buried diffusion conductor which extends to a metal-to-diffusion contact at a position displaced horizontally through the array, which provides contact to a vertical metal virtual ground bus.

The global bitlines extend vertically through the array to respective column select transistors 27, 28, through which a selected global bitline is coupled to sense amps and program data circuitry (not shown). Thus, the source of column select transistor 27 is coupled to global bitline 17, the gate of column select transistor 27 is coupled to a column decode signal $Y_1$, and the drain of the column select transistor 27 is coupled to conductor 29.

The blocks of FLASH EPROM cells as shown in FIG. 1 are configured into a plurality of subarrays as illustrated in FIG. 2. FIG 2 illustrates two subarrays within a larger integrated circuit. The subarrays are divided generally along dotted line 50 and include subarray 51A generally above the line 50 and subarray 51B generally below the line 50. A first block 52 is laid out in a mirror image with a second block 53 along a given bitline pair (e.g., bitlines 70, 71). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The subarrays repeat on opposite sides of the metal virtual ground line 59 so that adjacent subarrays share a metal virtual groundline 59. The metal virtual ground line 59 is coupled to array ground and erase high-voltage circuitry through a virtual ground select transistor 79 controlled by decoded signal $Z_n$. The virtual ground select transistor 79 can be used to isolate areas of the array sharing metal line 59 from high-voltage erases. Thus, the subarray layout requires two metal contact pitches per column of two transistor cells for the global bitlines and one metal contact pitch per subarray for the metal virtual ground line 59.

Furthermore, two subarrays, as illustrated in FIG. 2 may share wordline signals because of the additional decoding provided by the top and bottom block select signals TBSELA, TBSELB, BBSELA, and BBSELB.

In one preferred system, each subarray includes 8-blocks 32 two transistor cells and wordlines deep, so that there are a total of 16 global bitlines and 32 wordlines, providing a 512 cell subarray.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the program and erase operations, the high voltages of the virtual ground line, and the bit lines, are isolated from the unselected blocks. This allows a sectored erase operation.

It will be appreciated that the bottom block select transistors (e.g., transistors 65A, 65B) may not be necessary in a given implementation. Also, these block select transistors may share a bottom block select signal with an adjacent subarray, as illustrated below with respect to FIG. 6. Alternatively, the bottom block select transistors (e.g., 65A, 65B) may be by single isolation transistors adjacent the virtual ground terminals 60A, 60B.

FIG. 3 is a schematic block diagram of a FLASH EPROM integrated circuit according to the present invention. The FLASH EPROM includes a memory array 100 implemented as shown in FIG. 2. A plurality of redundant cells 101 is implemented in the preferred system so that any failed cells in the memory array may be replaced by redundant cells 101. In addition, the circuit includes a plurality of reference cells 102, block 103 which includes sense amps, program data-in circuits, and array ground and erase high-voltage circuits, and block 104 which includes word line and block select decoders, and block 105 which includes column decoders and virtual ground decoders. The reference cells are coupled to sense amplifiers in block 103 to account for variations in channel length, and the like, which may occur during fabrication and be reflected in the voltages or currents on the bitlines being sensed. The reference cells 102 may also be used in the generation of program and erase voltages. This redundant cell architecture is made possible by the segmented architecture of the FLASH EPROM arrays as discussed above.

The wordline and block select decoders 104 and the column and virtual ground decoder 105 are programmable after to sting so that redundant cells may replace inoperable cells in the memory array 100.

In addition, the circuit includes a mode control circuit 106 for controlling the erase, program and read operations; and the virtual ground, drain and wordline voltages used during the various operations.

The FLASH EPROM cells and the methods for fabricating the cells used in the circuits described above are illustrated with respect to FIGS. 4A through 4H in one embodiment, and with respect to FIGS. 5A through 5G in a second embodiment. A top view of a section of the integrated circuit is illustrated with respect to FIG. 6.

A first cell type is implemented as shown in FIGS. 4A–4H, which illustrate the primary steps involved in manufacturing the cell.

Figure 4A:
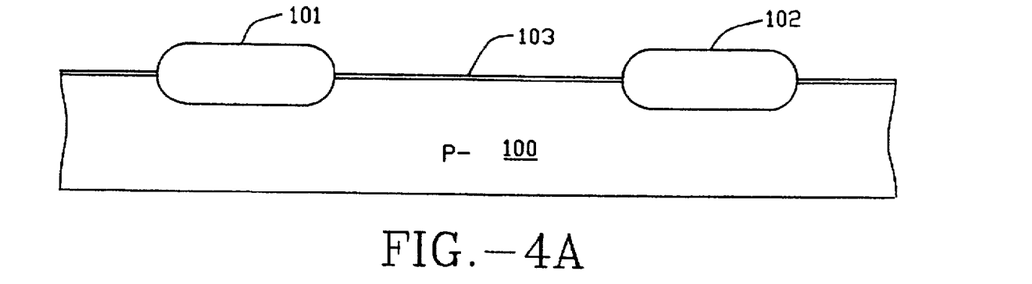
FIGS. 4A through 4H are cross-sectional views taken along a wordline in the FLASH EPROM circuit according to the present invention illustrating a first fabrication method and first cell type.

FIG. 4A illustrates a first step in the process. Starting with a P-silicon substrate 100, for making an n-channel cell, a well-known LOCOS field oxidation process is used to grow relatively thick field oxide regions 101, 102 which are elongated in a direction perpendicular to the page. Also, a thin oxide layer 103 is grown over the regions outside the field oxides 101 and 102.

Figure 4B:
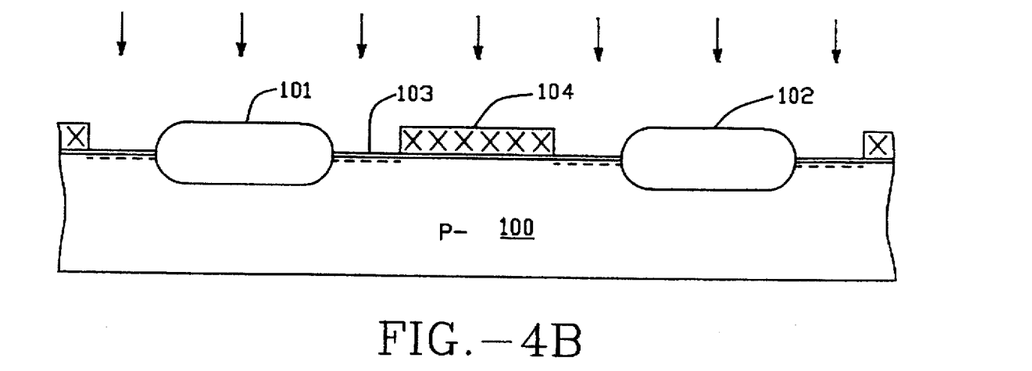

As illustrated in FIG. 4B, in the next step a photoresist mask is deposited between the field oxides 101 and 102, and elongated along a line essentially parallel to the field oxide regions 101, 102. This defines drain diffusion regions between the field oxide 101 and photoresist mask 104, and between the field oxide 102 and photoresist mask 104. An n-type dopant is implanted, as schematically represented by arrows, through the thin oxides 103 into the substrate 100. Thus, the drain diffusion regions are self-aligned with the isolation field oxides 101 and 102.

Figure 4C:
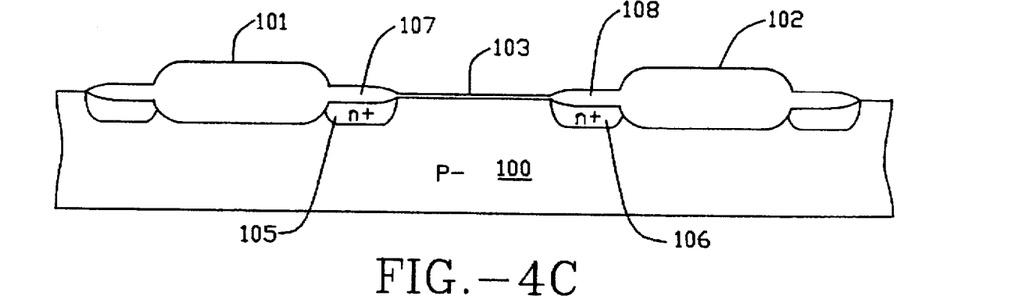

In the next step, the photoresist mask 104 is removed, and the substrate is annealed to drive in and activate the n-type dopant to form n+ local bitlines 105 and 106. Also, a drain oxide 107, 108 is grown over the diffusion bitlines 105 and 106.

Figure 4D:
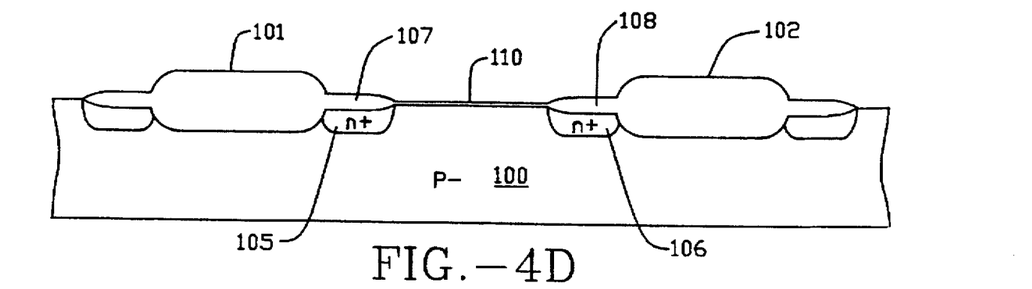

FIG. 4D illustrates a next step in the fabrication of the cell. In particular, the thin oxide 103 is removed by a blank wet etch, and a tunnel oxide 110 is grown in its place between the drain diffusion bitlines 105, 106. The tunnel oxide 110 in the preferred system is approximately 100 angstroms thick. The tunnel oxide 110, but may be less than about 120 angstroms for a FLASH EPROM cell. Thicker oxides maybe used for non-volatile cells, such as UV-EPROM cells, that do not use tunneling for the erase operation 5.

The oxides 107, 108 over the buried drain diffusion lines 105, 106 are approximately 1000 angstroms thick at this step.

Figure 4E:
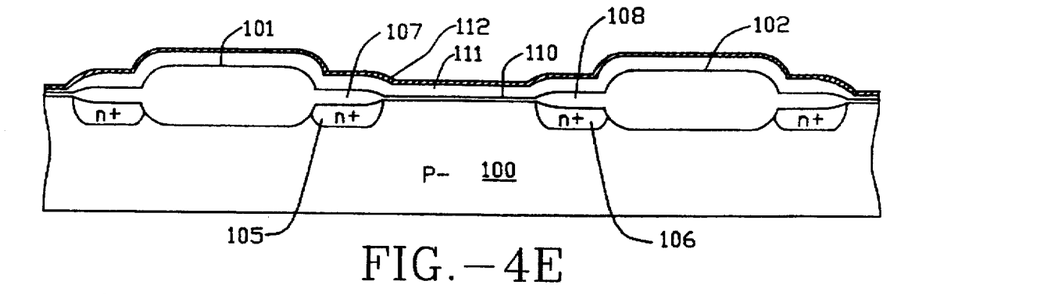

The next step as shown in FIG. 4E is to deposit a first layer of polysilicon 111, and dope-the polysilicon so that it is conductive. Then, an oxide/nitride/oxide (ONO) layer 112 is grown over the first poly layer 111 to provide control gate insulation. In this step, the poly 1 layer is approximately 1500 angstroms thick and the ONO layer is approximately 250 angstroms thick.

Figure 4F:
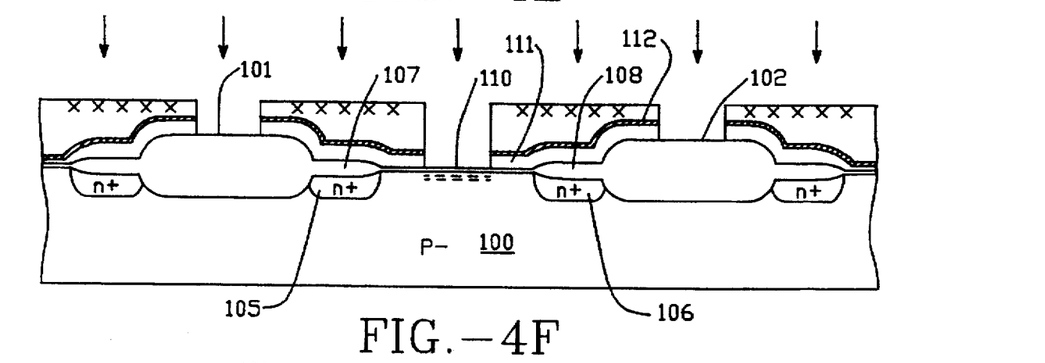

In FIG. 4F, a self-aligned source diffusion region is defined using a photo masking process. After the photo masking process, the poly 111 and the ONO insulation 112 are etched to expose the source diffusion regions. Also, the floating gate poly 111 and ONO layer 112 are etched to define the width of the floating gate. Thus, one side of the etched poly 1 defines a side of the source diffusion region, and the second side defines the width of the floating gate. In this embodiment, the second side is located over the field oxide region 101 or 102.

The source diffusion regions are then implanted with n-type dopants to form a n+/n− double-diffused diffusion region which is elongated and parallel with the drain diffusion regions 105, 106. The dopants used are phosphorous and arsenic together to form the double diffusion.

Figure 4G:
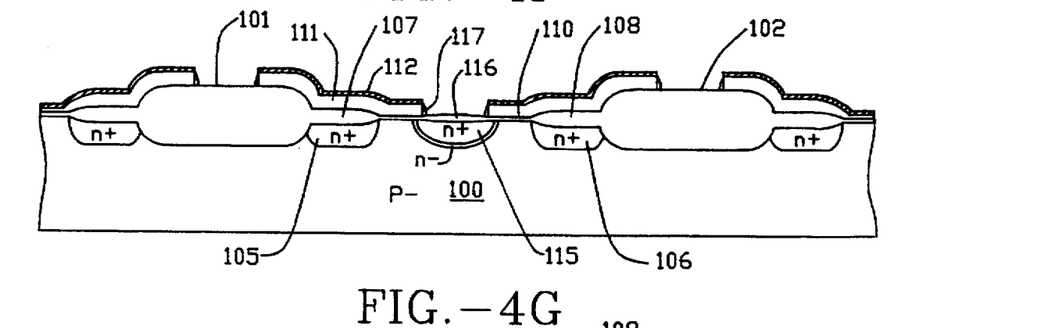

As illustrated in FIG. 4G, the photoresist is removed, and the substrate is annealed to drive in the n+ and n− dopants and activate the source diffusion region 115. Also, a source oxide 116 is grown, and oxides 117 are grown along the sides of the floating gates poly 111 to isolate the floating gates from the wordline poly to be defined later.

Figure 4H:
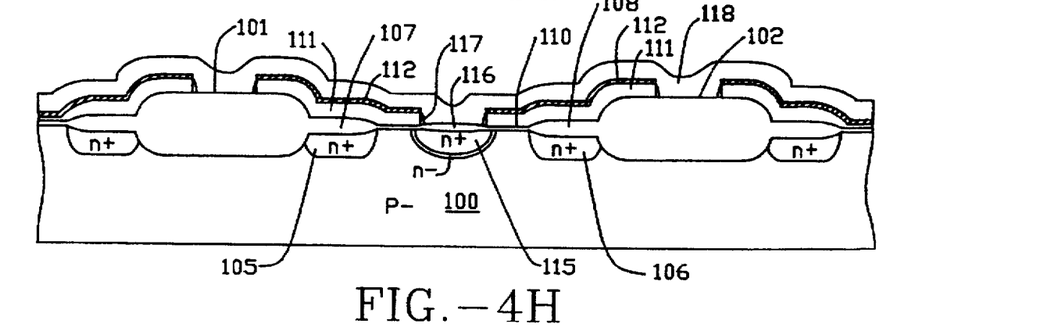

FIG. 4H illustrates a next step in the process of manufacturing the FLASH EPROM cell. This involves depositing the second layer of poly 118 and using a photo masking process to define the wordlines. In the photo masking process, the etch defining the wordlines is continued through the floating gate poly 111 to define the floating gates for respective transistors. The wordline 118 is approximately 4,500 angstroms thick. Finally, passivation and metalization layers (not shown) are deposited over the cells.

As can be seen in FIG. 4H, the cell structure results in a first transistor between drain diffusion line 105 and source diffusion line 115, and a second transistor between drain diffusion line 106 and source diffusion line 115. The floating gates extend from the source diffusion line 115 across the drain diffusion line 105 and over the field oxide 101. In a preferred embodiment, these floating gate oxides are a approximately 2.4 microns long and 0.8 microns in width, while the width of the tunnel oxide 110 over a given transistor from the edge of drain oxide 107 to the edge of source oxide 116 is approximately 1.2 microns. The extra area over the drain diffusion line 105 and the field oxide 202 is used to increase the coupling ratio through the floating gate to greater than about 50%. Because the ONO layer is approximately 250 angstroms thick and the tunnel oxide is approximately 100 angstroms thick, the coupling ratio must be improved by increasing the area of the floating gate. Alternatively, the ONO layer could be manufactured thinner to reduce the area needed for the floating gate.

As can be seen, the source diffusion is accomplished in a step independent of the drain diffusion, and is implemented with a different distribution of dopants in order to establish a gradual junction in a channel of the respective transistors to facilitate the source erase function. In a channel erase type or uverase type floating gate, the gradual junction and the source diffusion may not be necessary.

Figure 5A:
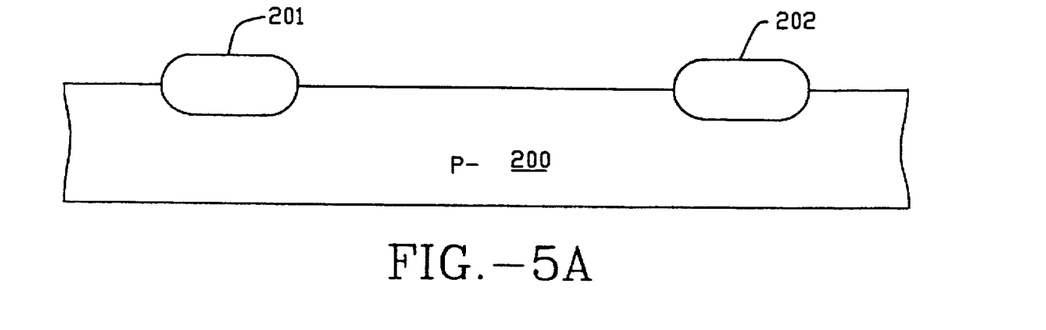
FIGS 5A through 5G are cross-sectional views taken along a wordline of a second type memory cell according to the present invention, illustrating a second fabricating method.
Figure 5B:
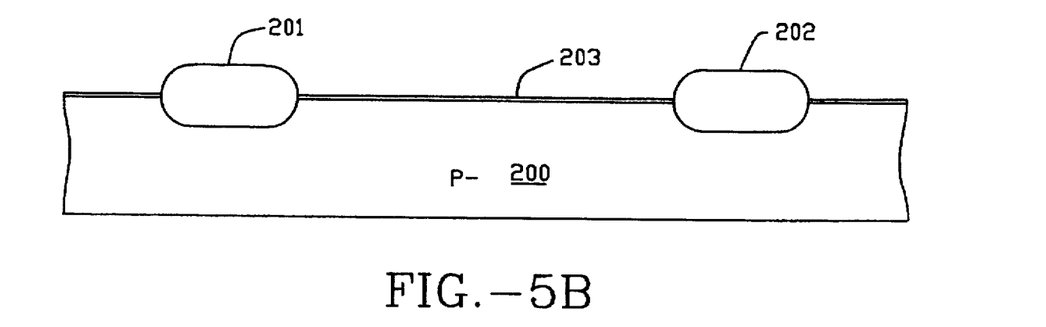
Figure 5C:
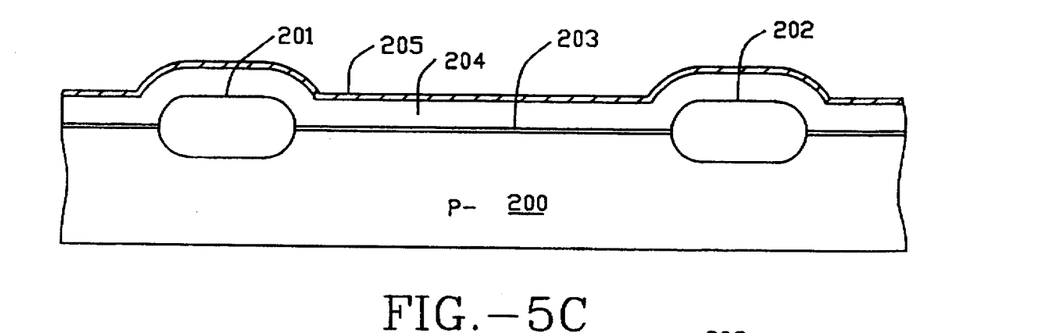

FIGS. 5A through 5G illustrate implementation of a second cell type according to the present invention. As illustrated in FIG. 5A, the first step involves growing field oxide regions 201, 202 such as described above with respect to FIG. 4A. Also, a sacrificial oxide layer is grown and then removed to prepare the substrate 200 for growing a thin tunnel oxide. As illustrated in FIG. 5B, a thin tunnel oxide 203 is grown about 100 angstroms thick. In the next step, the poly 1 layer is deposited and doped, and then an ONO layer 205 about 120 angstroms thick is grown so that the coupling ratio is greater than about 50%. Thicker thin oxide 203 and ONO 205 layers are used for UV-EPROM cells.

Figure 5D:
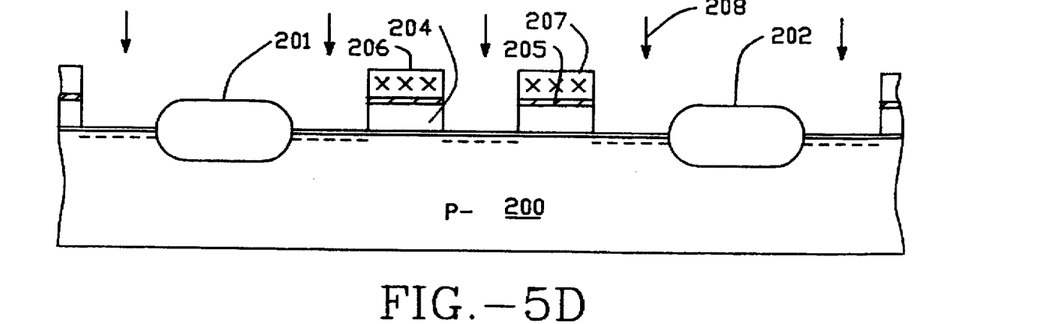

In FIG. 5D, a photo masking process is used to define floating gates, and the n+ source and drain diffusion regions. Thus, a photo mask layer 206 and 207 are defined to protect the floating gate regions. The poly 1 204 and ONO 205 layers are etched away except as protected by the masks 206 and 207 to expose the drain, source and drain regions. Next, the n-type dopants are implanted as illustrated at arrows 208 within the exposed regions. These regions are therefore self-aligned to the floating gates and field isolation regions.

Figure 5E:
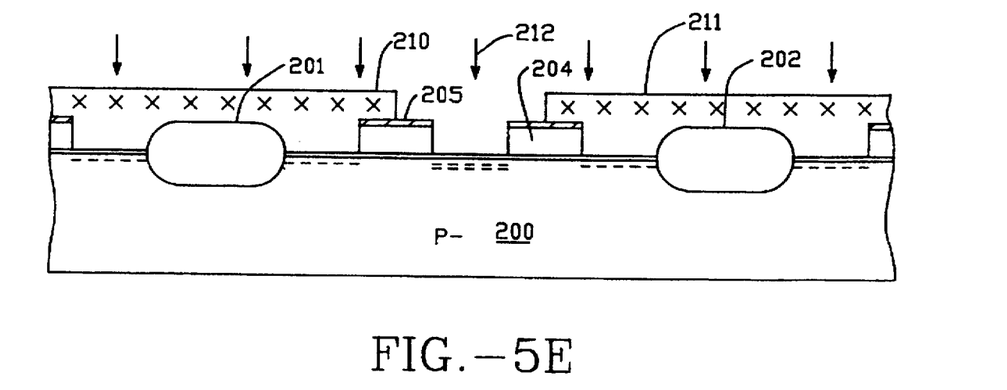

For a FLASH EPROM array, the next step is illustrated in FIG. 5E. According to this step, a photo masking process is used to define masks 210, 211 which cover the drain regions and isolation regions. In this step, an n− dopant is implanted, represented by arrows 212, so that the source region has an n+ and n− dopants to prepare for performing a gradual junction. The steps in FIG 5E can be omitted for example in UV erase EPROM cells.

Figure 5F:
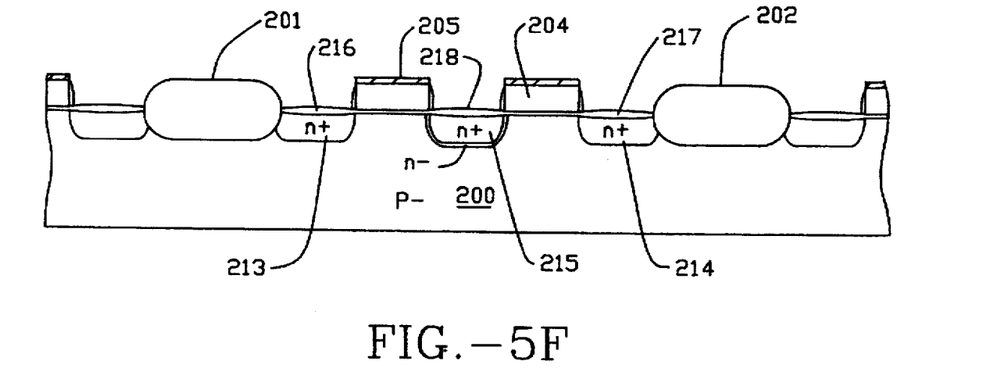

As illustrated in FIG. 5F, the substrate is annealed to activate the dopants and define the drain diffusion regions 213 and 214 and the source diffusion region 215. Also, drain oxides 216, 217 and source oxide 218 are grown, along with oxides covering the sides of the floating gate poly.

Figure 5G:
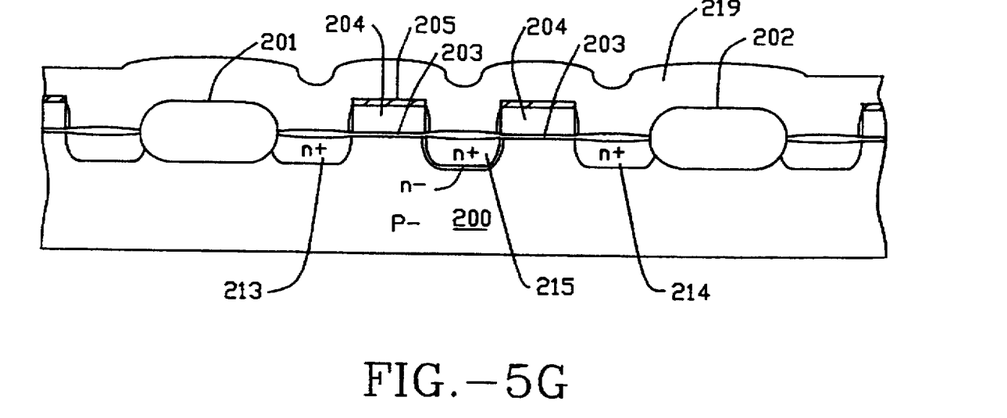

Finally, as illustrated in FIG. 5G, the second layer of poly 219 is deposited and etched to define the transistors. In this embodiment, the ONO sandwich 205 has a thickness within about plus or minus 20% of the thickness of the tunnel oxide so that the coupling ratio is high enough (about 50%) without the necessity of using a floating gate extended over the drain and field isolation regions. Finally, passivation and metalization layers (not shown) are deposited over the circuit of FIG. 5G.

Thus, as can be seen in FIG. 5G, the cell structure according to the second type includes a first transistor between the buried drain diffusion region 213 and the buried source diffusion region 215, and a second transistor between the buried drain diffusion region 214 and the buried source diffusion region 215. Each of the transistors includes a floating gate implemented with the first layer of poly 204. The floating gate is insulated from the channel region of the respective transistor by the tunnel oxide 203 and insulated from the control gate in the wordline poly 219 by an ONO layer to 205. The ONO layer 205 has a thickness within about + or −20% of the thickness of the tunnel oxide 203 to insure a sufficiently high coupling ratio for/EPROM operation because of the thickness of the ONO layer 205 in the cell type illustrated with respect to FIGS. 5A through 5G is sufficiently thin, the surface area of the floating gate does not need to be extended as done in the first type of cell structure illustrated with respect to FIGS. 4A though 4H. Furthermore, in the structure as illustrated in FIG. 5G, the first and second drain diffusion regions 213, 214 and the source diffusion region 215 are all self-aligned with the floating gate structure implemented by the first layer of poly 204 and the ONO insulating layer 205. This insures that the channel length of the respective transistors is substantially equal.

Figure 6:
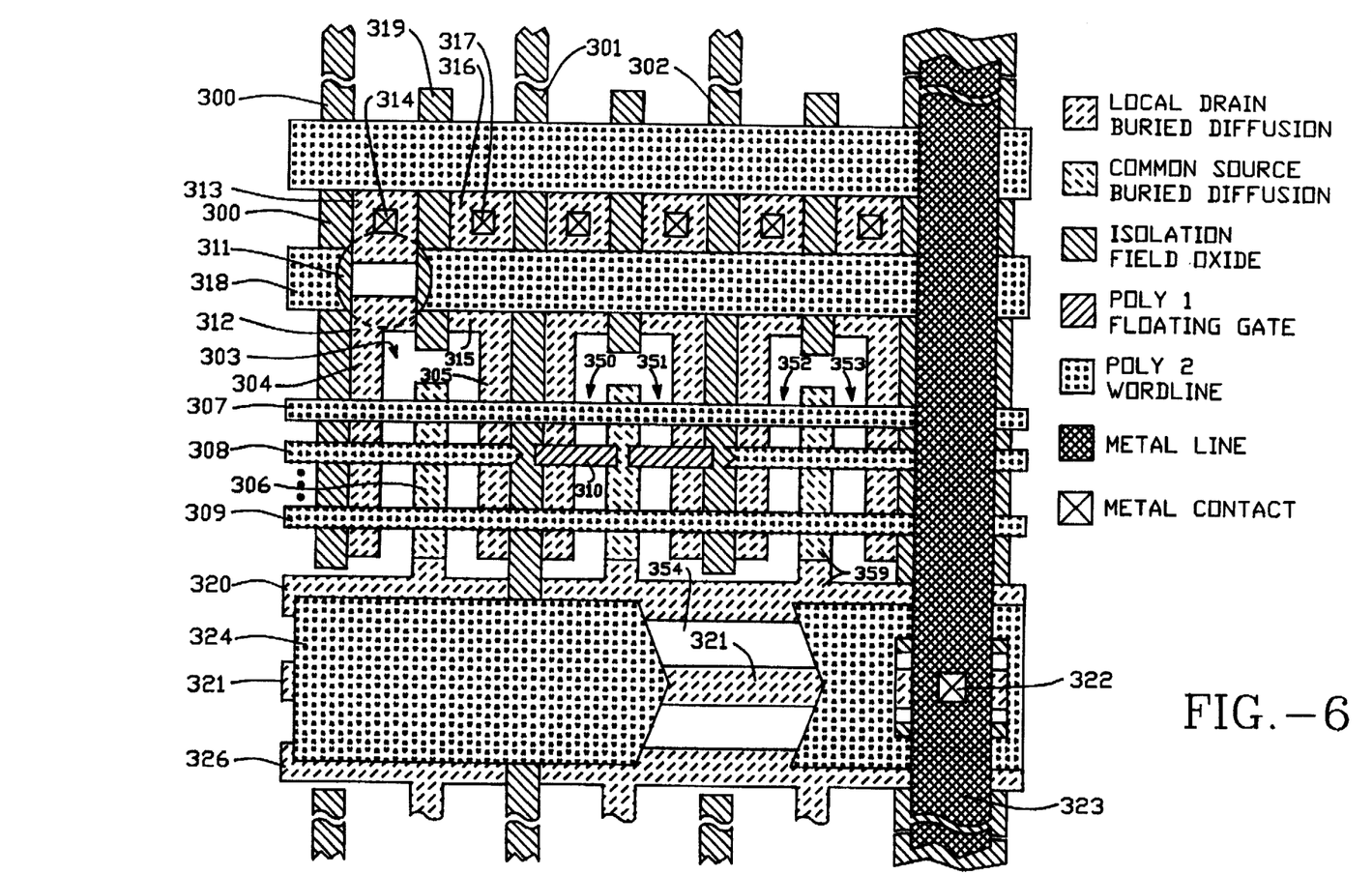
FIG. 6 is a top view of a FLASH EPROM subarray manufactured according to the method of FIGS. 4A through 4H.

In FIG. 6, a layout view of subarrays of the integrated circuit EPROM is provided, for the EPROM cells illustrated in FIG. 4H. It will be understood that the layout is substantially the same for cells implemented as shown in FIG. 5G, with the exception of the size of the floating gate viewed from the top perspective. Thus, as can be seen in FIG. 6, the integrated circuit includes a plurality of elongated isolation regions 300, 301, 302 which extend vertically through the subarray. These isolation regions correspond to the thick oxides 101 and 102 in FIG. 4H. These field oxides 300, 301 define an isolated region, generally 303 in between them. Within the isolated region are a first elongated buried diffusion line 304 and a second elongated buried diffusion line 305 which correspond to the diffusion lines 105 and 106 of FIG. 4H. In between the elongated buried diffusion lines, lies an elongated source diffusion line 306 which corresponds to the diffusion line 115 of FIG. 4H. A plurality of wordlines 307, 308 ... 309 intersects the isolated regions to define the control gates of the floating gate transistors in the array. Floating gates, (e.g., see cutaway 310) overlie the substrate between the respective wordline in the tunnel oxide.

The top block select transistors are coupled to each of the buried diffusion lines 304, 305 which define local bitlines. The block select transistors, e.g., in the region 311, have a drain 312 which is coupled with the elongated buried diffusion region 304 and a source 313 which is coupled through a metal to diffusion contact 314 to a metal line (not shown) which extends parallel with the isolation region 300 over the subarray. Similarly, the second buried diffusion line 305 is coupled to the drain 315 of a top block select transistor which has its source 316 coupled to a metal-to-diffusion contact 317 and through the contact to the vertical metal line (not shown) acting as a global bitline. The gates of the top block select transistors are established by the top block select wordline 318 which extends horizontally across the array. The top block select transistor which couples the local bitline 304 to the metal-to-diffusion contact 314 is isolated from the block select transistor which couples the local bitline 305 to the metal-to-diffusion contact 317 by a field oxide region 319. Thus, each column of transistors can be selected independently for read and program operations.

The local source diffusion 306 is coupled to a bottom block select transistor having a buried diffusion source 320 and a buried diffusion drain The buried diffusion drain is an elongated buried diffusion conductor which extends horizontally across the array to a metal-to-diffusion contact 322, which the in turn is connected to the metal line 323 which supplies the virtual ground voltage to the array. The bottom block select transistors are controlled by the poly 2 select line 324. As can be seen, the poly 2 select line 324 is shared by the subarray illustrated in the figure and a subarray 325 generally below the figure. The subarray 325 includes a block select source region 326 which shares the buried diffusion drain 321 that connects the subarray to the virtual ground bus. Thus, the poly 2 bottom block select signal is supplied across a wide structure 324 which extends from the source region 320 in the first subarray to the source region 326 in the second subarray 325. In this way, the bottom block select signal operates to enable the local virtual ground diffusions 306 for subarrays on each side of the drain diffusion region 321.

Of course, alternative embodiments could be implemented where the bottom block select signal is individually controlled for each subarray requiring separate block select signal wordlines 324 for each subarray. Also, the bottom block select transistors could be implemented, one for each buried diffusion line, in a manner similar to the top block select transistors. In another alternative, the, bottom block select transistor could be replaced by conductor with a single-isolated transistor near the metal-to-diffusion contact 322 controlling a plurality of local virtual ground bitlines.

An isolation region, e.g., isolation region 301, periodically extends through the bottom block select source region 320 and drain region 321 to isolate the bottom block select transistor in adjacent subarrays.

As can be seen a virtual ground metal bus 323 extends vertically across the figure. It is coupled to the bottom block select transistors at the metal-to-diffusion contact 322.

The isolation region 301 separates subarrays on either side of the field oxide 301 by isolating the bottom block select transistors. As shown in FIG. 6, a subarray would thus include the four (for example) columns of transistors 350, 351, 352, 353, all sharing a common bottom block select transistor generally in the region 354. Preferred systems may include 16 columns of transistors (8 blocks of two transistor cells) per subarray. The transistors formed by the diffusion regions 304, 305 thus lie in a separate subarray from the transistors in columns 350 and 351. Transistors lying to the right of the virtual ground metal line 323 would also lie in a separate subarray. Because of the shared bottom block select transistors controlled by the bottom block signal on line 324, four subarrays (two on each side of the metal 323) will have their source diffusion regions, e.g., 359, coupled to the virtual ground bus 323 in response to a signal on line 324. This results in sectored erase for four subarrays at a time.

In conclusion, there are several distinct features of the non-volatile memory design of the present invention. First, the metal-pitch constraint of adjacent drain and source bitlines is relaxed by the shared common source (virtual ground) bitlines, which are coupled to only one metal source line running parallel with every 16, 32, or more, metal drain contact lines or global bitlines. This allows a very dense core array to be achieved. Second, the FLASH EPROM array is divided into subarrays, while it is selected by fully decoded block select lines. Thus sector erase becomes feasible, and disturbance of a memory cell only occurs while its corresponding subarrays are selected. This should greatly improve product performance and the reliability. Third, as to the first cell type in FIGS. 4A through 4G, the source side of the cell is not subjected to numerous oxidation cycles, so that the source junction edge should maintain very good integrity. More particularly, the source junction edge should not suffer the dopant depletion and oxide edge thickening effects of cells designed according to prior art techniques which involve more extensive oxidation cycles after source implants. For this reason, a better source erase performance of the new cells is expected. Furthermore, a reasonably high gate coupling ratio can be realized through the unique cell layout where the floating gate polysilicon layer extends over the drain and field oxide regions, significantly increasing the coupling area of the control gate to the floating gate polysilicon.

As to the second cell design illustrated with respect to FIGS. 5A through 5G, the drain-source-drain configuration of the present invention can be achieved with self-aligned process for both the drain and source diffusion, yielding a substantially uniform channel length for all the memory cell transistors in the array.

Thus, a new FLASH EPROM cell and array architecture have been provided. Some key features of the new cell designs include:

1. A very dense core array obtained by unique cell layouts, where two adjacent local drain bitlines share one common source bitline, and only one metal source bitline runs parallel with every subarray of cells;

2. Sector erase is now feasible using the segmentable architecture of the present invention; and 3. A high performance and reliable flash memory array can be achieved.

An n-channel embodiment of the FLASH EPROM array has been disclosed. Those skilled in the art will recognize a p-channel equivalent circuit can be implemented using techniques known in the art. Furthermore, the architecture has been designed with respect to the FLASH EPROM cells. It can be adapted to any memory circuit array. Thus, the storage cells in the memory array may be implemented using ROM technology, PROM technology, EPROM technology, UV erase EPROM technology or other EPROM technology. Furthermore, the FLASH EPROM disclosed has been implemented for the purposes of source erase operations. It can be adapted to channel erase operations if desired.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A memory circuit on a semiconductor substrate, comprising:

K subarrays having N columns and M rows of floating gate storage cells, storage cells in the columns having respective first terminals in the substrate, second terminals in the substrate and control terminals;

a plurality of word lines coupled to the control terminals of storage cells in respective rows;

a patterned conductor layer isolated from and over the plurality of word lines including a plurality of global bit lines arranged in a first direction;

a plurality of local bit lines in the substrate, each coupled to the first terminals of the M storage cells in a respective column within a respective subarray;

resources that selectively connect the local bit lines in a subarray of storage cells to the corresponding global bit lines in response to first subarray select signals;

a plurality of local virtual ground lines in the substrate, each coupled to the second terminals of M storage cells in one adjacent column and M storage cells in another adjacent column within a respective subarray;

a plurality of virtual ground supply lines in the patterned conductor layer and located near respective sets of subarrays arranged in the first direction so as to be substantially parallel with the global bit lines;

virtual ground supply circuitry disposed beneath the patterned conductor layer, coupled to the plurality of virtual ground supply lines and the plurality of local virtual ground lines which connect virtual ground supply lines with local virtual ground lines in a subarray in a corresponding set of subarrays, the virtual ground supply circuitry includes a select transistor, the select transistor has one terminal coupled to more than one of the local virtual ground lines in the corresponding set of subarrays through a contactless connection, the select transistor has a second terminal coupled to a ground supply line in the corresponding set of subarrays, the select transistor has a control terminal coupled to a decoder; and column select circuits, coupled to the global bit lines, which selectively enable access to the N columns of storage cells.

2. The memory circuit of claim 1, wherein the virtual ground supply circuitry comprises a conductor substantially orthogonal to the first direction; coupled with the corresponding virtual ground supply line; the second terminal is coupled to the conductor, and the control terminal is coupled to a second subarray select signal.

3. The memory circuit of claim 1, further including:

mode control resources coupled with the virtual ground terminal, the global bit lines, the subarray select signals and the word lines to provide program, read and erase modes for the storage cells.

4. The memory circuit of claim 1, wherein the storage cells comprise electrically erasable and programmable read only memory cells, and said storage cells consist of single floating gate transistors.

5. The memory circuit of claim 1, wherein the storage cells comprise floating gate transistors.

6. The memory circuit of claim 1, wherein the local bit lines and local virtual ground lines comprise diffusion regions in the substrate.

7. The memory circuit of claim 1, further including:

a plurality of redundant storage cells;

decoders providing the word line signals, column select signals and subarray select signals; and programmable circuitry coupled with the decoders to replace storage cells within the N columns of storage cells with redundant storage cells.

8. A floating gate memory circuit with supply resources for erase, program and read supply voltages, comprising:

an array of electrically erasable floating gate memory cells arranged in a plurality of subarrays in which the array includes a plurality of global bit lines, global bit lines being shared by a plurality of subarrays, and wherein the subarrays comprise a plurality of columns of floating gate memory cells, each column of cells within a subarray coupled to a contactless local buried diffusion bit line, and each column of cells within a subarray coupled to a contactless local buried diffusion virtual ground line;

at least one virtual ground terminal;

subarray select circuitry coupled to the plurality of subarrays which connects erase potentials to cells within one or more selected subarrays in the plurality of subarrays, and which isolates other subarrays in the plurality of subarrays from the potentials including circuitry to selectively connect the local buried diffusion bit lines within a subarray to a corresponding set of global bit lines, and to isolate other subarrays from the corresponding set of global bit lines, and selectively connect the local buried diffusion virtual ground lines within a subarray to the virtual ground terminal, and to isolate other subarrays from the virtual ground terminal, the subarray select circuitry includes at least one select transistor, a first terminal of the select transistor is coupled to more than one of the local buried diffusion virtual ground lines within the subarray through a contactless connection, a second terminal of the select transistor is coupled to the virtual ground terminal, and a control terminal is coupled to aid in the selective connection of the more than one of the local buried diffusion virtual ground lines within the subarray to the virtual ground terminal.

9. The floating gate memory circuit of claim 8, in which the subarrays comprise a plurality of pairs of columns of flash EPROM cells, each pair of columns of cells within a subarray including first and second local buried diffusion bit lines, interconnecting drain terminals of first and second columns of cells, respectively, in the pair, and including one local buried diffusion virtual ground line interconnecting source terminals of the first and second columns of cells in the pair.

10. A memory circuit on a semiconductor substrate, comprising:

an array of electrically erasable floating gate memory cells, having drain terminals, source terminals and control gates, the array arranged in a plurality of subarrays in which the subarrays include a set of local drain lines, each local drain line in the set interconnecting the drain terminals of memory cells in a column of cells in the subarray, a set of local source lines, each local source line in the set interconnecting the source terminals of memory cells in a column of cells in the subarray, and word lines interconnecting the control gates of a row of cells in one or more subarrays;

a patterned metal layer isolated from and over the word lines and including a plurality of global bit lines and a plurality of source supply lines;

local source decoding circuitry, responsive to addresses, to selectively connect local source lines in a subarray to a corresponding source supply line and to isolate local source lines in other subarrays from source supply lines, wherein the local source decoding circuitry in a given subarray includes a source supply conductor substantially orthogonal to the plurality of source supply lines and coupled with a source supply line adjacent to the given subarray; and a select transistor having a first terminal coupled to more than one local source line in the given subarray through a contactless connection, and a second terminal coupled to the source supply conductor, and a control terminal coupled to a decoder; and local drain decoding circuitry, responsive to addresses, to selectively connect local drain lines in a subarray to a corresponding global bit line and to isolate local drain lines in other subarrays from global bit lines.

11. The memory circuit of claim 10, wherein the local drain lines compose buried diffusion regions in the semiconductor substrate.

12. The memory circuit of claim 10, wherein the local source lines comprise buried diffusion regions in the semiconductor substrate.

13. The memory circuit of claim 10, wherein at least one subarray in the plurality of subarrays comprises a plurality of sets of columns of cells, the sets of columns including a first local drain line, a shared local source line and a second local drain line in which the local source line interconnects sources of a first column of cells between the first local drain line and the shared local source line and a second column of cells between the shared local source line and the second local drain line respectively.

14. The memory circuit of claim 13, wherein the local drain lines and the local source lines comprised buried diffusion regions in the semiconductor substrate.

15. The memory circuit of claim 10, wherein the first terminal of the select transistor is coupled to all of the local source lines in the given subarray.

16. The memory circuit of claim 10, wherein the local source lines and the source supply conductor comprise buried diffusion regions in the semiconductor substrate.

17. The memory circuit of claim 10, wherein the global bit lines are arranged in a first direction, the wordlines are arranged in a second direction orthogonal to the global bit lines, the local drain lines and local source lines comprise buried diffusion regions arranged in the first direction, the source supply conductor comprises a buried diffusion region arranged in the second direction, and the control terminal of the select transistor comprises a conductor arranged in the second direction.

18. A memory circuit on a semiconductor substrate, comprising:

an array of floating gate memory cells, having drain terminals, source terminals and control gates, the array arranged in a plurality of subarrays in which the subarrays include a set of local drain lines, each local drain line in the set comprising a contactless buried diffusion region interconnecting the drain terminals of memory cells in a column of cells in the subarray, a set of local source lines, each local source line in the set comprising a contactless buried diffusion region interconnecting the source terminals of memory cells in a column of cells in the subarray, and word lines arranged orthogonally to the local drain and source lines interconnecting the control gates of a row of cells in one or more subarrays;

a plurality of global bit lines;

a plurality of source supply lines;

local source decoding circuitry, responsive to addresses, to selectively connect the set of local source lines in a subarray to a corresponding source supply lines and to isolate local source lines in other subarrays from source supply lines, including for a given subarray a source supply conductor arranged orthogonally to the plurality of local drain and source lines, and connected to a source supply line, and a select transistor having a first terminal coupled to a subset including more than one member of the set of local source lines in the given subarray, and a second terminal coupled to the source supply conductor, and a control terminal, local drain decoding circuitry, responsive to addresses, to selectively connect the set of local drain lines in a subarray to a corresponding global bit line and to isolate local drain lines in other subarrays from global bit lines.

19. The memory circuit of claim 18, wherein at least one subarray in the plurality of subarrays comprises a plurality of sets of columns of cells, the sets of columns including a first local drain line, a shared local source line and a second local drain line in which the local source line interconnects sources of a first column of cells between the first local drain line and the shared local source line and a second column of cells between the shared local source line and the second local drain line respectively.

20. The memory circuit of claim 1, wherein the virtual ground supply circuitry includes an orthogonal conductor substantially orthogonal to the plurality of virtual ground supply lines.

21. The memory circuit of claim 20, wherein the orthogonal conductor comprises a buried diffusion region in the substrate substantially orthogonal to the plurality of local virtual ground lines.

22. The memory circuit of claim 1, wherein the orthogonal conductor comprises a conductive strip below the patterned conductor layer.

23. The memory circuit of claim 18, wherein the source supply conductor comprises a buried diffusion region in the substrate substantially orthogonal to the plurality of local drain and source lines.

* * * * *